United States Patent [19]

Schroeder et al.

[11] 4,096,402
[45] Jun. 20, 1978

[54] MOSFET BUFFER FOR TTL LOGIC INPUT AND METHOD OF OPERATION

[75] Inventors: Paul R. Schroeder; Robert J. Proebsting, both of Dallas, Tex.

[73] Assignee: Mostek Corporation, Carrollton, Tex.

[21] Appl. No.: 644,856

[22] Filed: Dec. 29, 1975

[51] Int. Cl.² ............... H03K 5/20; H03K 5/18; G11C 8/00
[52] U.S. Cl. .................. 307/362; 307/264; 307/DIG. 1; 307/DIG. 4; 365/230
[58] Field of Search ............... 307/221 C, 353, 355, 307/362, 363, DIG. 1, DIG. 3, DIG. 4, 238, 279; 340/173 R

[56] References Cited

U.S. PATENT DOCUMENTS

| | | | |
|---|---|---|---|
| 3,729,723 | 4/1973 | Yamamoto | 307/238 X |
| 3,760,381 | 9/1973 | Yao | 307/DIG. 3 X |
| 3,789,239 | 1/1974 | Heeren | 307/221 C |
| 3,882,326 | 5/1975 | Kruggel | 307/238 X |
| 3,891,977 | 6/1975 | Amelio et al. | 307/DIG. 3 X |
| 3,892,984 | 7/1975 | Stein | 307/279 |
| 3,906,464 | 9/1975 | Lattin | 307/DIG. 3 X |
| 3,959,781 | 5/1976 | Mehta et al. | 307/238 X |

*Primary Examiner*—Larry N. Anagnos

*Attorney, Agent, or Firm*—James J. Mullen

[57] ABSTRACT

An input buffer for MOSFET integrated circuit for receiving low level voltage signals even below the threshold voltages of the transistors comprising the circuit is described. A reference voltage between two logic levels of the input voltage, such as TTL logic signals of 0.8 volts and 1.8 volts, is trapped on a reference storage node and the logic input voltage is trapped on a data input storage node. The two trapped voltages are then capacitively boosted by the same voltage to a level well above the transistor threshold voltage so that the differences in the voltage levels can be amplified, and the logic signal latched up by conventional circuitry. The voltage levels need be only momentarily boosted above the threshold level. The circuit includes a system for protecting against input voltage undershoot which includes another capacitive input storage node with a first trapping transistor between the logic input to the circuit and the second storage node and a second trapping transistor between the second storage node and the data input storage node. This prevents any degradation of voltage level on the data storage node should the input logic level momentarily be pulled more than one threshold below the level, typically ground, to which the gates of the transistors are taken after the voltage is trapped on the data node.

6 Claims, 3 Drawing Figures

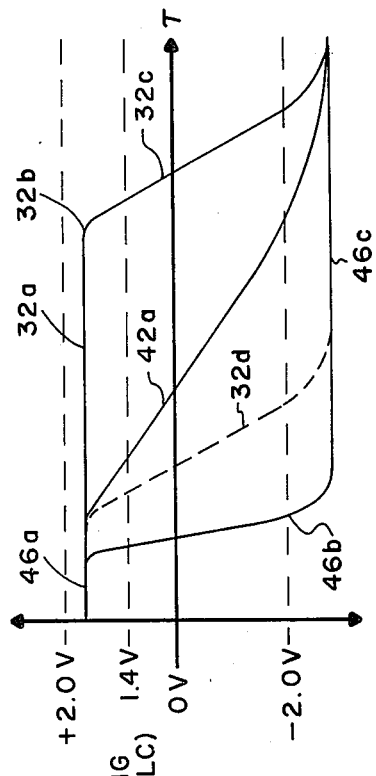
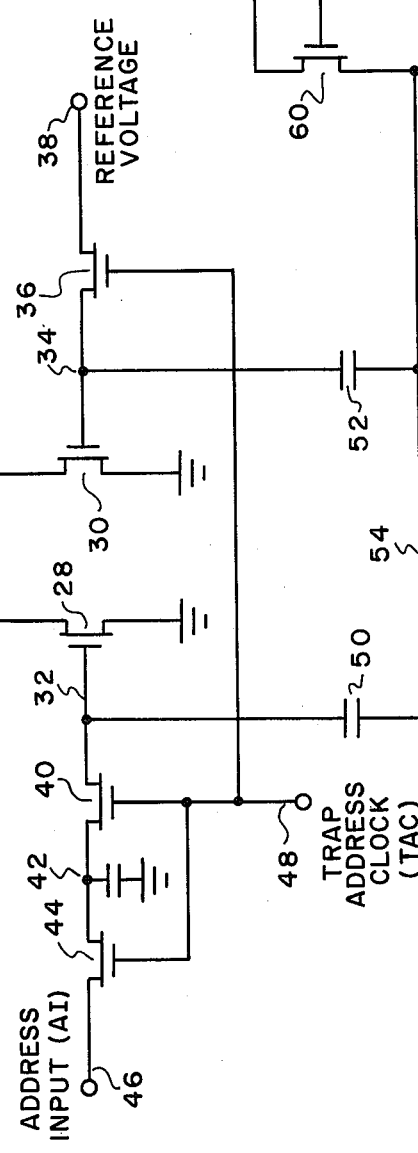
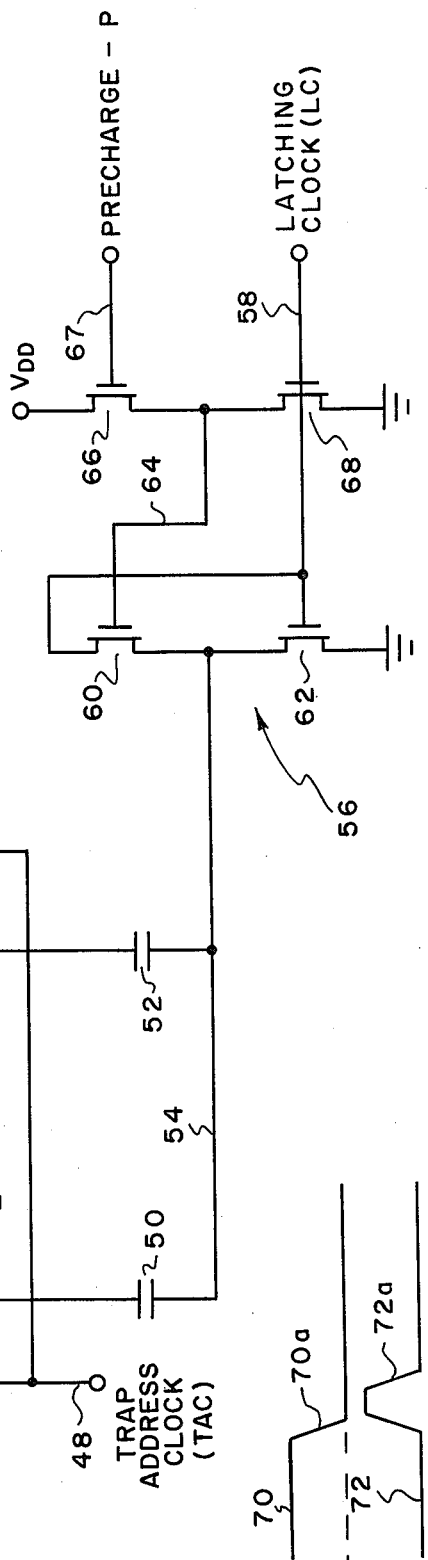
FIG. 1
FIG. 2
FIG. 3

MOSFET BUFFER FOR TTL LOGIC INPUT AND METHOD OF OPERATION

This invention relates generally to MOSFET integrated circuits, and more particularly relates to an input buffer for receiving low level logic signals such as those typically produced by bipolar TTL logic circuits.

A broad class of integrated semiconductor circuits has been developed within the past decade utilizing field effect transistors. This class of circuits is commonly referred to as MOSFET circuits although more recent technology sometimes utilizes a gate node other than metal, typically a polycrystaline silicon, and insulation other than oxide. By far the largest application for this type of integrated circuit lies in the field of digital data processing. One widespread use of this type of circuit is in the fabrication of random access read only memories or random access read/write memories. In each case, it is necessary to input binary logic signals to the integrated circuit in order to select one of many memory cells for reading and/or writing. For various reasons, it is desirable to generate the address signals, as well as many other signals controlling the circuits, using bipolar logic circuits, typically of the so-called transistor-transistor logic (TTL) type. However, typical voltage levels for TTL circuits are about 1.8 volts for logic "1" and 0.8 volts for a logic "0". On the other hand, FET transistors in MOSFET circuits often have threshold voltages on the order of 2.0 volts and thus do not even function as amplifying devices for voltage levels below this threshold. Specially processed and designed circuits, particularly those using ion implantation, have provided means for interfacing directly with TTL logic levels. However, for various reasons, including economic, it is desirable to maintain circuit operation even for threshold voltages generally at or above the maximum TTL voltage level.

In any data handling system, access time is of prime importance. In operating random access memory chips, a series of events occur in order to address a particular cell, sense the logic level stored in the cell, read the sensed logic level out of the memory chip, and write new data into the cell. It is customary to require that the address lines be maintained at the appropriate level for a certain period of time while data is read from or written into the addressed storage cell, so that the time for switching the address inputs is not critical. When the same input pins to the chip are used sequentially for both row and then for column address inputs, as described in co-pending U.S. application Ser. No. 513,091, filed on Oct. 8, 1974, now U.S. Pat. No. 3,969,706, however, the time required to switch the address inputs becomes very significant.

The present invention is concerned with a data input buffer for a circuit utilizing field effect transistor technology which samples and holds a logic input voltage on a data input storage node. A reference voltage is simultaneously sampled and stored on a reference storage node. Then the sample input voltage and the sample reference voltage are simultaneously capacitively boosted substantially above the transistor threshold voltage, the difference in voltage is amplified by a differential amplifier, and a binary latch set to indicate the appropriate logic level of the binary input signal.

In accordance with a more specific aspect of the invention, the input voltage signal is transferred through a first transistor to an isolation node having a relatively large capacitance, and then through a second transistor to the input storge node which has a relatively small capacitance. The first and second transistors are then turned off by taking the respective gates to a low voltage, typically circuit ground. This arrangement prevents any discharge of the voltage on the data storage until the capacitance of the isolation node has first been discharged.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

FIG. 1 is a schematic circuit diagram of a data input system in accordance with the present invention;

FIG. 2 is a plot of voltage with respect to time which serves to illustrate one aspect of the operation of the circuit of FIG. 1; and FIG. 3 is a timing diagram which serves to illustarte the operation of the circuit of FIG. 1.

Referring now to the drawings, a data input circuit in accordance with the present invention is indicated generally by the reference numeral 10 in FIG. 1. The circuit 10 includes a latching flipflop 12 having true and complement logic outputs 14 and 16, respectively, which produce binary logic levels determined by the relative voltage levels of inputs 18 and 20 at the time a clock signal (LC) is applied to latching clock input 24. The latch 12 may be of any suitable conventional design. A differential amplifier 26 provides voltage signals of different levels which are determined by the degree of transconductance of a pair of transistors 28 and 30 which are respectively connected between the two inputs of the differential amplifier and ground. The differential amplifier 26 may be of any suitable conventional design.

The gate node 32 of transistor 28 provides a data input storage node having a capacitance, and the gate node 34 of transistor 30 provides a reference voltage storage node having a similarly sized capacitance. The reference storage node 34 is connected through a transistor 36 to a suitable conventional reference voltage source represented by node 38. An address input terminal 46, which is a pin connection to address circuitry external to the integrated circuit is connected by transistor 44 to a relatively large capacitive node 42 which, in turn, is connected by another transistor 40 to the input data storage node 32. The voltage levels typically applied to the terminal 46 are those associated with bipolar TTL logic circuitry, and typically defined as a logic "1" level when above about 1.8 volts and as a logic "0" level when below about 0.8 volts. The reference voltage applied to terminal 38 is a level between the defined logic "0" and logic "1" levels, which is 1.4 volts in the example.

The gates of trapping transistors 44, 40 and 36 are all connected to a common node 48 which receives a momentary positive going pulse from a clock circuit (not illustrated) typically formed on the integrated circuit chip, which is referred to as the trap address clock (TAC). The trap address clock TAC goes high and back to the source supply voltage, represented by the conventional ground symbol before the latching clock terminals 24 and 58 go high as will presently be described.

Nodes 32 and 34 are capacitively coupled by capacitors 50 and 52, respectively, to a node 54. Node 54 is momentarily driven high by a pulse generator indicated generally by the reference numeral 56 in response to the latching clock signal applied to node 58. The pulse generator 56 is comprised of a relatively high transconductance transistor 60 and a relatively low transconductance transistor 62 which are connected in series between the latching clock node 58 and ground. Node 54 is connected to the source of transistor 60 and the drain of transistor 62. The gate node 64 of transistor 60 is precharged to a voltage near $V_{DD}$ through transistor 66 during a precharge signal which terminates prior to the latching clock signal LC and is discharged to ground through transistor 68 which is turned on by the latching clock signal LC. Transistors 62 and 68 are both low transconductance compared to transistor 60.

The time relationship between the voltages of clock signals P, TAC and LC are represented schematically by lines 70, 72 and 74 respectively in FIG. 3, and the voltage on node 54 is represented by line 76.

In the operation of the circuit 10, the precharge clock signal P is high during a precharge period and clock signals TAC and LC are low. As a result, transistor 66 is turned on and node 64 is charged to turn transistor 60 on. The latching clock signal LC is low so that nodes 54, 58 and 24 are at ground, so that transistors 68 and 62 are turned off. The latch 12 and differential amplifier 26 are prepared for a latching cycle by appropriate precharge signals (not illustrated). The address input node 46 is then established at the desired logic input level, typically about 0.8 volts or about 1.8 volts, which may be below the threshold voltage transistors 28 and 30. The trap address clock TAC 48 may go high at any time so that the reference voltage on node 38 is transferred through transistor 36 to reference storage node 34, and the logic input voltage on terminal 46 is transferred through transistor 44 to charge isolation node 42 and then through transistor 40 to charge data input storage node 32 to substantially the same voltage level as terminal 46. Then the trap address clock node 48 is returned to ground potential to turn trapping transistors 36, 40 and 44 off, as represented by event 72a in FIG. 3, and thereby trap the reference voltage on reference storage node 34, and trap the input voltage on both data input storage node 32 and on isolation node 42. The precharge signal goes low (event 70a) before the latching clock LC is taken high (event 74a), for example, to a voltage near $V_{DD}$. The relatively high voltage on node 58 passes through transistor 60 to node 54, as represented by event 76a and is coupled through capacitors 50 and 52 to boost nodes 32 and 34 substantially above the threshold voltages of transistors 28 and 30, which then conduct to different extents. As a result, the differential amplifier 26 produces an amplified differential signal on inputs 18 and 20 to the latch 12 which is latched as a result of the latching clock signal LC on node 24. Since transistor 62 is also turned on by the latching clock signal on node 58, as is transistor 68, the relatively low transconductance transistor 68 discharges node 64 to ground, thereby turning transistor 60 off, so that relatively low transconductance transistor 62 then discharges node 54 to ground, as represented by event 76b. This capacitively pulls nodes 32 and 34 back to the original voltage levels and the cycle is complete. It will be appreciated that the voltage signal applied to node 54 could be of relatively long duration, depending upon type of circuit selected for the differential amplifier 26 and latch 12. However, the short duration pulse provided by the pulse circuit 56 is preferred for most operations.

The effect of isolation node 42 and transistor 44 in preventing degradation of the voltage level trapped on data input storage node 32 in the event the input terminal 46 is taken more than one threshold below the voltage on TAC node 48 is illustrated in FIG. 2. For example, assume that a logic "1" level of about 1.8 volts is applied to node 46 and effectively transferred to nodes 42 and 32 during the time the trap address clock TAC on node 48 is high, and that the trap address clock node 48 then returns to ground potential. If node 46 goes more than one threshold below the low level of clock node 48, transistor 44 will conduct and decrease the voltage isolation on node 42. For a worse case situation, assume that as the data input terminal 46 is switched from about +1.8 volts as represented at solid line segment 46a in FIG. 2, to ground the voltage overshoots to a value more negative than −2.0 volts as represented by segment 46b, and maintains a negative voltage level greater than −2.0 volts for some period of time as represented by segment 46c. In such a case, transistor 44 would begin to conduct at the time the voltage on gate node 48 is more positive than the voltage on terminal 46 by a value equal to the threshold voltage of transistor 44, which is assumed to be 2 volts. As a result, the voltage on isolation node 42 would follow the slope of line 42a. However, transistor 40 will not conduct to discharge node 32 until the voltage on node 42 is also one threshold below the gate voltage of node 48. As a result, the voltage on data input storage node 32 will remain at substantially the full original charge level as represented by segment 32a until about point 32b, and then will fall along the slope of line 32c. It will be noted that because of the relatively small differential between a logic "1" voltage level of about 1.8 volts and the reference voltage level of 1.4 volts, the tolerance to discharge of node 32 is very slight. If isolation node 42 is not provided, data input storage node would be discharged along dashed line 32d. However, unless the voltage on the input node 46 remains at a level below −2.0 volts for a sufficient period of time to discharge node 42 below −2.0 volts, node 32 will not be discharged at all. The protection against overshoot can be increased by increasing the capacitance of node 42 and/or decreasing the size of transistor 44 at the expense, of course, of prolonging the time required to completely charge node 32.

From the above detailed description of a preferred embodiment of the invention, it will be appreciated that a data input buffer system has been described which requires that address input signals, or other data input signals, be maintained only for a period of time sufficient to charge the storage node 32 and isolation node 42. Further, the sampling system provides considerable protection against overshoot noise on the address input terminal as the input voltage is switched to new input data while the previous data is still being latched. The system also provides a means for directly interfacing MOSFET integrated circuits having relatively high threshold voltage with bipolar TTL circuits which have logic voltage levels below the threshold voltages of the MOSFET transistors.

Although a preferred embodiment of the invention has been described in detail, it is to be understood that various changes, substitutions and alterations can be made therein without departing from the spirit and scope of the invention as defined by the appended claims.

What is claimed is:

1. In an MOSFET integrated circuit chip, the data input system comprising:
   a data input terminal for receiving an input voltage signal from circuitry off the chip;
   a capacitive data input storage node;
   a capacitive isolation node; first circuit means including first and second transistors which are connected such that the data input terminal is connected through the channel of the first transistor to the capacitive isolation node and the capacitive isolation node is connected through the channel of the second transistor to the capacitive data input storage node;
   second circuit means coupled to the gates of the first and second transistors for momentarily turning the first and second transistors "on" then "off", substantially in synchronism, to charge the input storage node substantially to the voltage level of the input terminal and then trap the voltage level on the data input storage node; and
   third circuit means for comparing the trapped voltage level to a reference voltage level and producing a logic signal defining whether the trapped voltage level was greater than or less than a voltage level which has a predetermined relationship with the reference voltage level.

2. The data input system of claim 1 further comprising:
   a capacitive reference voltage storage node;
   fourth circuit means including a third transistor for charging the reference voltage storage node to a reference voltage, the third transistor being controlled in synchronism with the first and second transistors by the second circuit means, and wherein
   the third circuit means compares the trapped voltage levels on the data input storage node and the reference voltage storage node.

3. The data input system of claim 2 wherein the third circuit means includes means for capacitively boosting the voltage levels stored on the storage nodes and comparing the boosted voltage levels.

4. The data input system of claim 3 wherein the third circuit means further includes a latching flipflop which is set to either a first or a second logic state in response to the relative levels of the boosted voltage levels.

5. The data input system of claim 3 wherein said capacitive boosting means including a common voltage pulse capacitively coupled to each of the storage nodes.

6. In an MOSFET integrated circuit chip, the method for inputting, sampling and storing an input voltage on the chip which comprises transferring at least a portion of the input voltage level through a first transistor to a capacitive isolation node and from the capacitive isolation node through a second transistor to a capacitive storage node, and then turning the first and second transistors off to trap a voltage level on the isolation node and a voltage level on the storage node and capacitively boosting the voltage stored on the storage node to a higher voltage and producing a logic level from the higher voltage representative of the level of the input voltage.

* * * * *